(12) United States Patent
Correll et al.

(10) Patent No.: US 8,123,545 B1
(45) Date of Patent: Feb. 28, 2012

(54) LATCH AND EXTRACTOR FOR ELECTRONIC MODULE

(75) Inventors: Michael Anthony Correll, Hershey, PA (US); Terry Lee Barber, Harrisburg, PA (US)

(73) Assignee: Phoenix Contact, Inc., Middletown, PA (US)

( * ) Notice: Subject to any disclaimer, the term of this patent is extended or adjusted under 35 U.S.C. 154(b) by 0 days.

(21) Appl. No.: 13/069,676

(22) Filed: Mar. 23, 2011

(51) Int. Cl.
*H01R 13/627* (2006.01)

(52) U.S. Cl. .................................................. 439/352

(58) Field of Classification Search .......... 439/350–358, 439/372, 953
See application file for complete search history.

(56) References Cited

U.S. PATENT DOCUMENTS

| | | | |
|---|---|---|---|
| 6,319,042 B2 * | 11/2001 | Hirschmann | 439/352 |
| 7,134,914 B1 | 11/2006 | Wu | |
| 7,175,465 B1 * | 2/2007 | Tsai | 439/352 |
| 7,341,472 B2 | 3/2008 | Chao et al. | |
| 7,699,651 B2 | 4/2010 | Rosenberger et al. | |
| 2008/0081511 A1 | 4/2008 | Lloyd et al. | |
| 2008/0254655 A1 | 10/2008 | Zahlmann et al. | |
| 2009/0246999 A1 * | 10/2009 | Crofoot et al. | 439/352 |

FOREIGN PATENT DOCUMENTS

| | | |
|---|---|---|
| DE | 102006034164 A1 | 11/2007 |
| WO | 2006084529 A1 | 8/2006 |
| WO | 2008009507 A1 | 1/2008 |

\* cited by examiner

*Primary Examiner* — Phuong Dinh
(74) *Attorney, Agent, or Firm* — Hooker & Habib, P.C.

(57) ABSTRACT

An electronic module for mounting on a base includes a module body and a latch extractor assembly having a metal latch member with a spring arm, a shift member and a latch, and an extractor engageable with the shift member for movement of the latch out of engagement with the base.

19 Claims, 11 Drawing Sheets

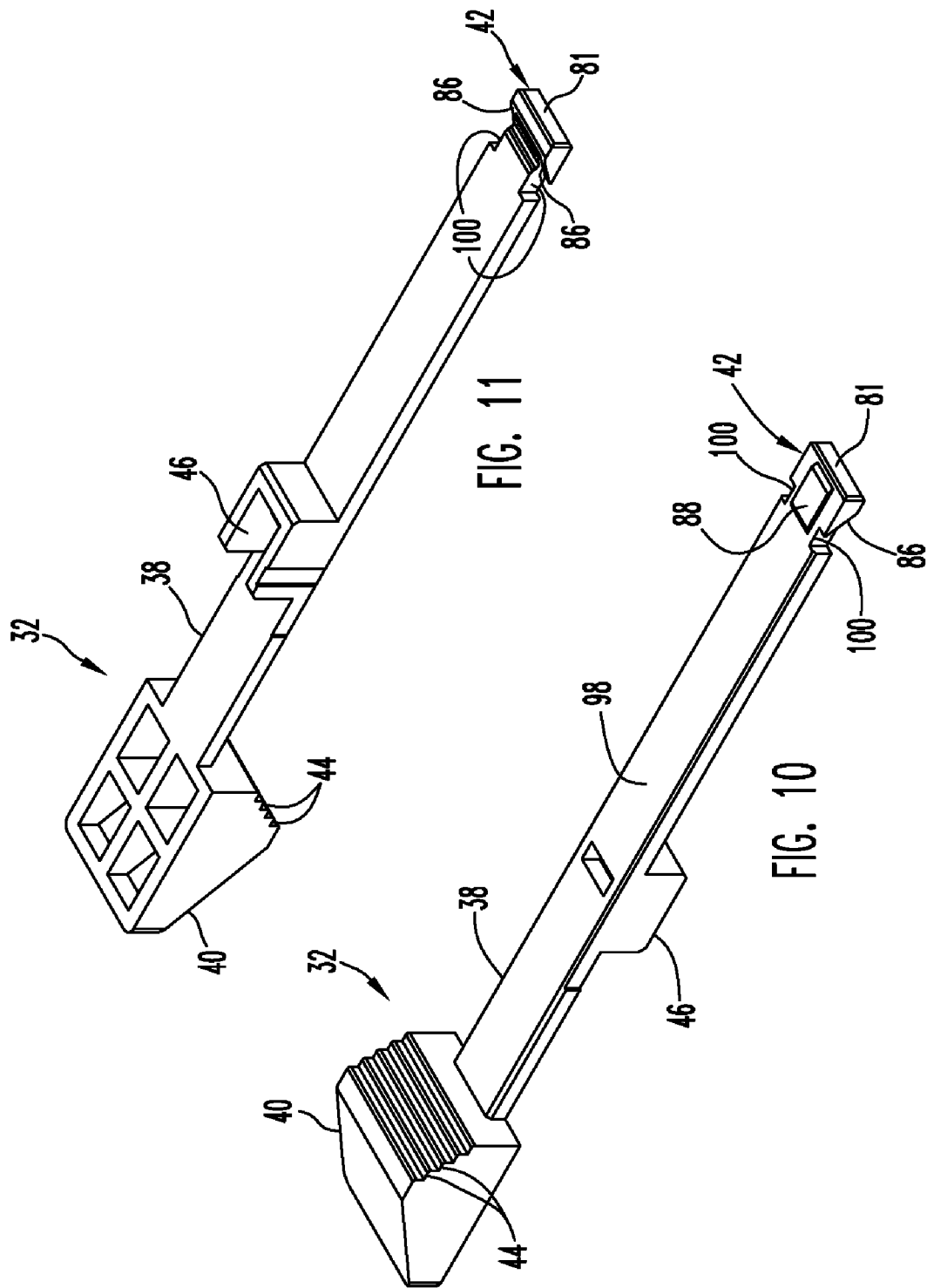

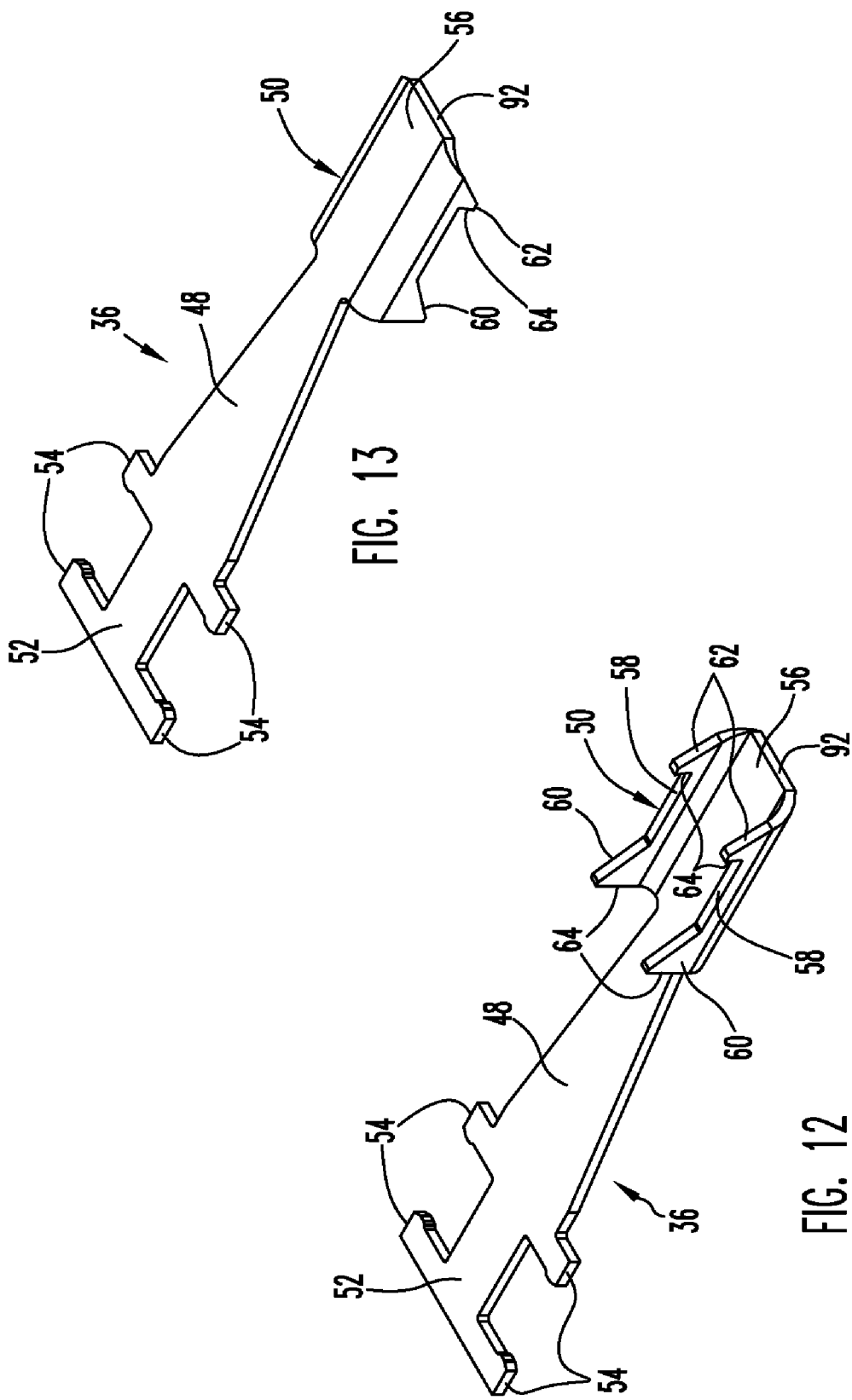

LATCH AND EXTRACTOR FOR ELECTRONIC MODULE

FIELD OF THE INVENTION

The field of the invention relates to an electronic module which is removably mounted on a base. During mounting, the module is latched to the base and electrical connections are established between an electronic component in the module and the base.

BRIEF SUMMARY OF THE INVENTION

The invention is an improved latch and extractor for removably mounting an electronic module on a base. The latch and extractor includes spring latches which engage the base when the module is pushed into the base. The module is easily unlatched and removed from the base by pulling upwardly on opposed grip elements to unlatch the module from the base. The module is unlatched by short initial upward movement of the grip elements relative to the module. After unlatching, further upward movement of the grip elements removes the module from the base. After removal of the module, the grip elements automatically return to their initial positions.

The grip elements are on extractors which engage latch members holding the module on the base. The latch members have stiff shift member lower ends. The shift members transmit unlatching forces from the extractors to the latch arms engaging the base without bending to shift the arms from latched positions to unlatched positions in response to small initial upward movement of the grip elements. The shift members are channel-shaped and transmit unlatching forces without bending.

BRIEF DESCRIPTION OF THE DRAWINGS

FIGS. 10 and 11 are perspective views of both sides of an extractor; and

FIGS. 12 and 13 are perspective views of both sides of a latch member.

DESCRIPTION OF THE PREFERRED EMBODIMENT

Figure 1:
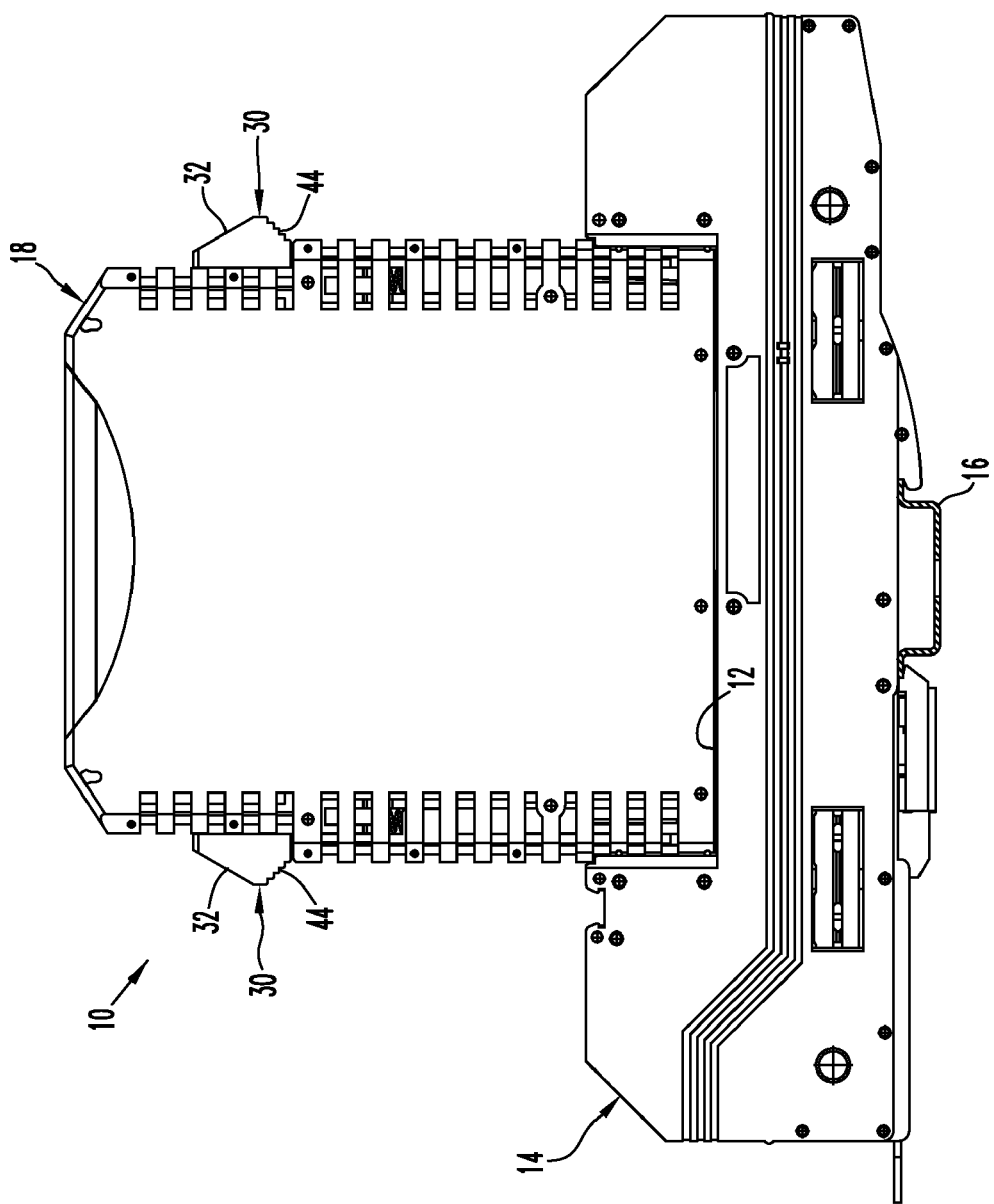
FIG. 1 is a side view of an electronic module mounted on a base.
Figure 2:
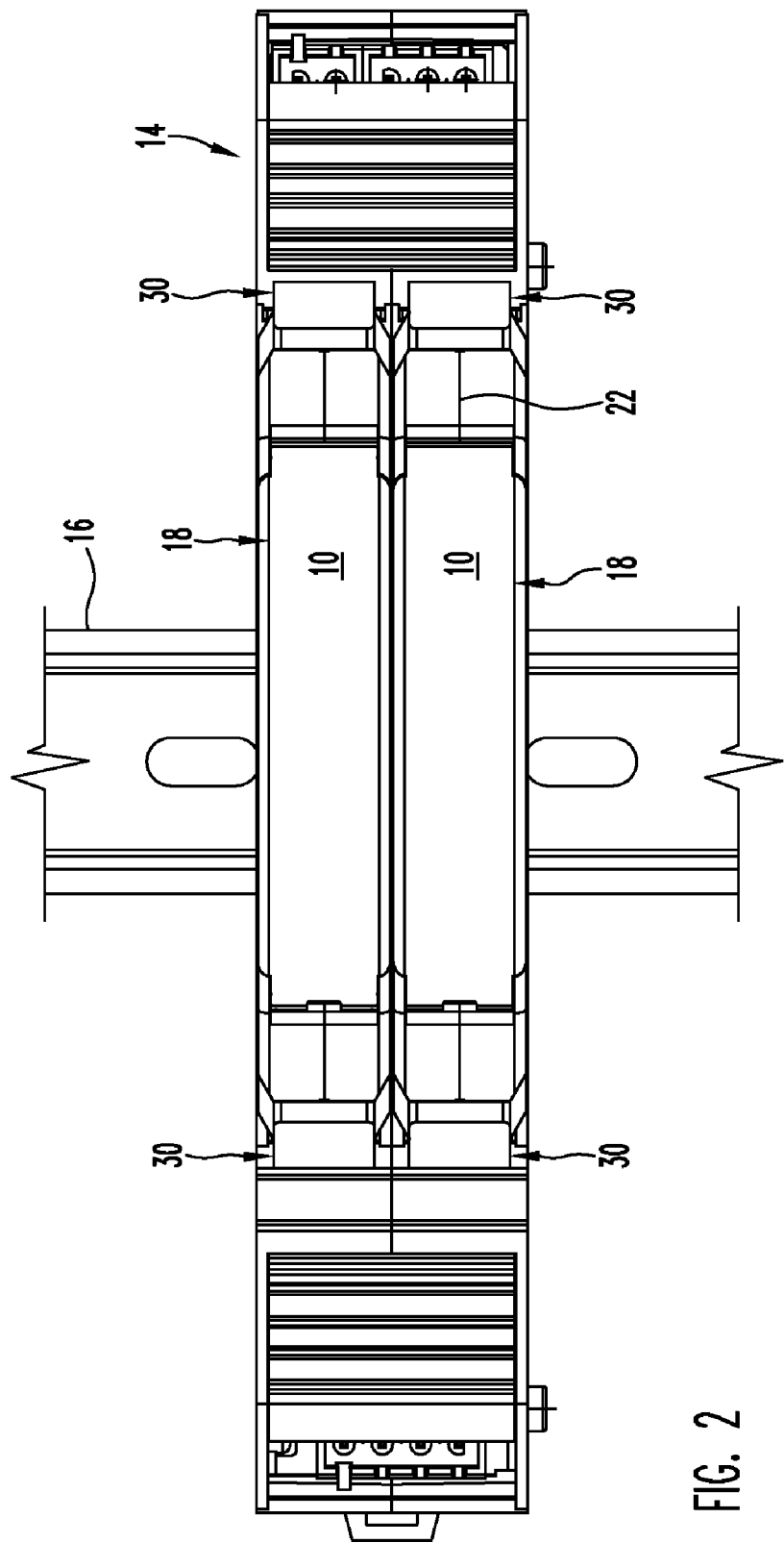
FIG. 2 is a top view of FIG. 1.

Electronic module 10 is removably mounted in recess 12 on base 14 which is typically mounted on DIN rail 16. The module 10 includes body 18 formed by two hollow molded plastic shells 20 joined together at a circumferential seam 22 defining a hollow interior cavity 24. An electronic component 26 is mounted in cavity 24 and includes an electrical connector 28 which forms electrical connections with a complementary electrical connector (not illustrated) positioned in an opening in the bottom of recess 12 when the module is inserted into the recess, as shown in FIG. 1.

Base 14 may be a power supply base for a process fieldbus. The electronic component 26 in module 10 may be a power supply device which regulates the voltage of DC power supplied to a process fieldbus connected to the base despite variation in the voltage of the power supplied to the module. Other types of electronic components may be mounted in the module 10. The module may be mounted on other types of bases.

The module 10 is removably mounted on base 14 by two like latch extractor assemblies 30 located on opposed edges of the module. Each assembly 30 includes a molded plastic extractor 32, return coil spring 34 and metal latch member 36. Each extractor 32, shown in FIGS. 10 and 11, includes an elongate strip body 38 extending between grip element 40 on one end of the body and cam end 42 on the opposite end of the body. The grip element 40 extends out from one side of body 38 and includes a number of closely spaced grip edges or corners 44 extending along a diagonal side of the grip element. The edges 44 face down toward recess 12 and facilitate manual engagement of the elements 40 and moving of the extractors 32 away from recess 12 to unlatch and remove the module from base 14, as described below.

Spring pocket 46 is provided on strip body 38. When assemblies 30 are mounted in module 10, grip elements 40 extend outwardly from the edges of the module and pockets 46 extend inwardly toward the interior of the module. The recesses in spring pockets 46 face the upper ends of strip bodies 38 and grip elements 40.

Latch member 36, shown in FIGS. 12 and 13, is formed from flat, uniform-thickness strip metal and includes an elongate, tapered-width spring arm 48, a channel-shaped shift member 50 at the narrow lower end of arm 48 and a mounting member 52 at the wide upper end of arm 48. The width of arm 48 is tapered to reduce stress concentration. Mounting member 52 includes pairs of mounting ribs 54 extending to either side of spring arm 48.

Stiff channel-shaped shift member 50 includes a flat base 56 forming an extension of spring arm 48 and opposed sidewalls 58 bent up 90 degrees to base 56 and extending upwardly from one side of the base. Angled follower arms 60 extend above sidewalls 58 and are adjacent spring arm 48. Angled latch arms 62 extend above sides 58 and are on the end of shift member 50 away from arm 48. The angled edges of arms 60 and 62 face down, away from spring arm 48.

Figure 6:
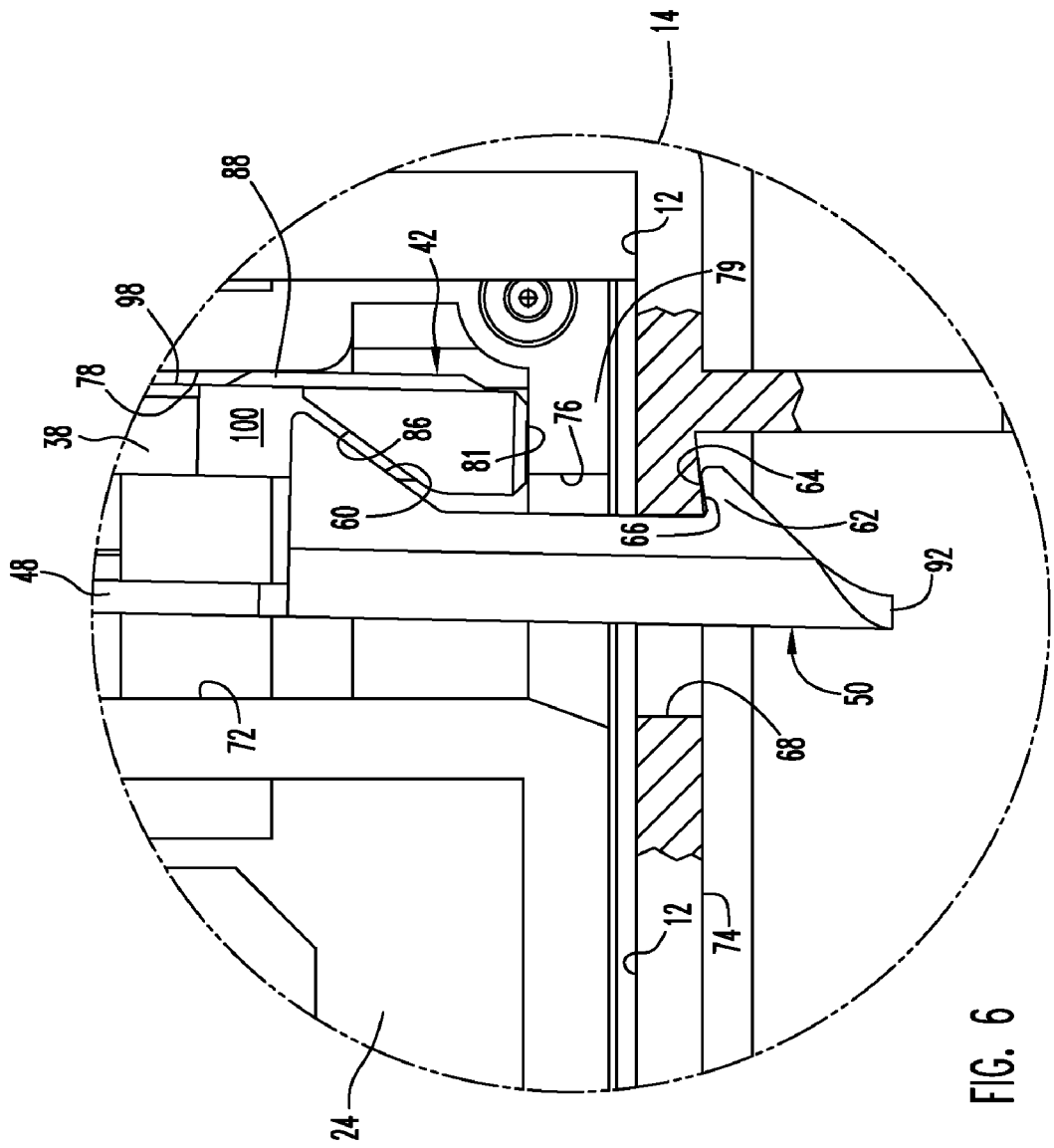
FIGS. 6 and 7 are enlarged views of portions of FIGS. 4 and 5 showing the latched and unlatched positions of the assembly.

Latching surfaces 64 on arms 62 face up toward spring arm 48 and are undercut to improve latching engagement with complementary, angled latch surface 66 on an inner side of base wall 74 at the bottom of recess 12, as shown in FIG. 6.

Figure 3:
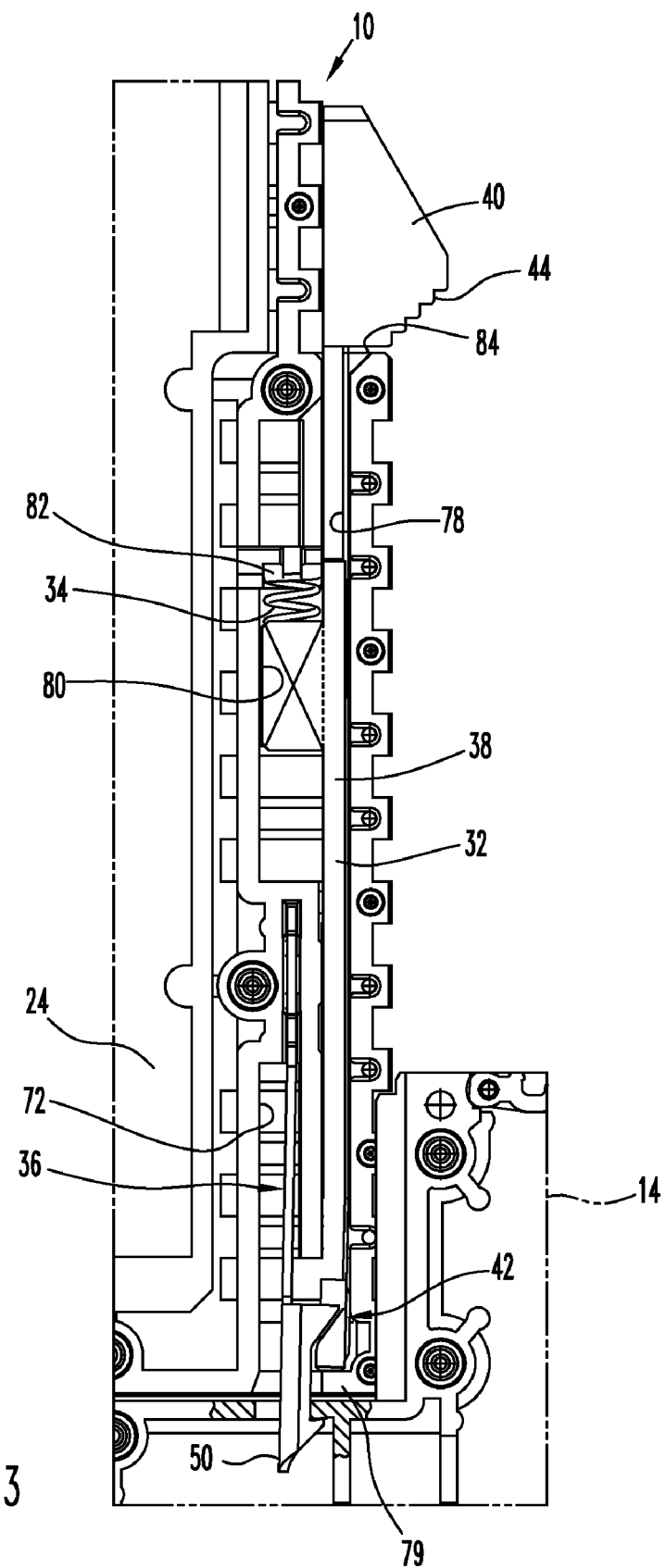
FIG. 3 is a vertical sectional view taken along through one side of the module illustrating a latch and extractor assembly in the latched position.

The two latch extractor assemblies 30 are identical. Each assembly is mounted on one edge of module body 18. Mounting of an assembly 30 on the right edge of the module shown in FIG. 3 will now be described, it being understood that the latch extractor assembly on the left edge of the module is similarly mounted on the module.

Figure 8:
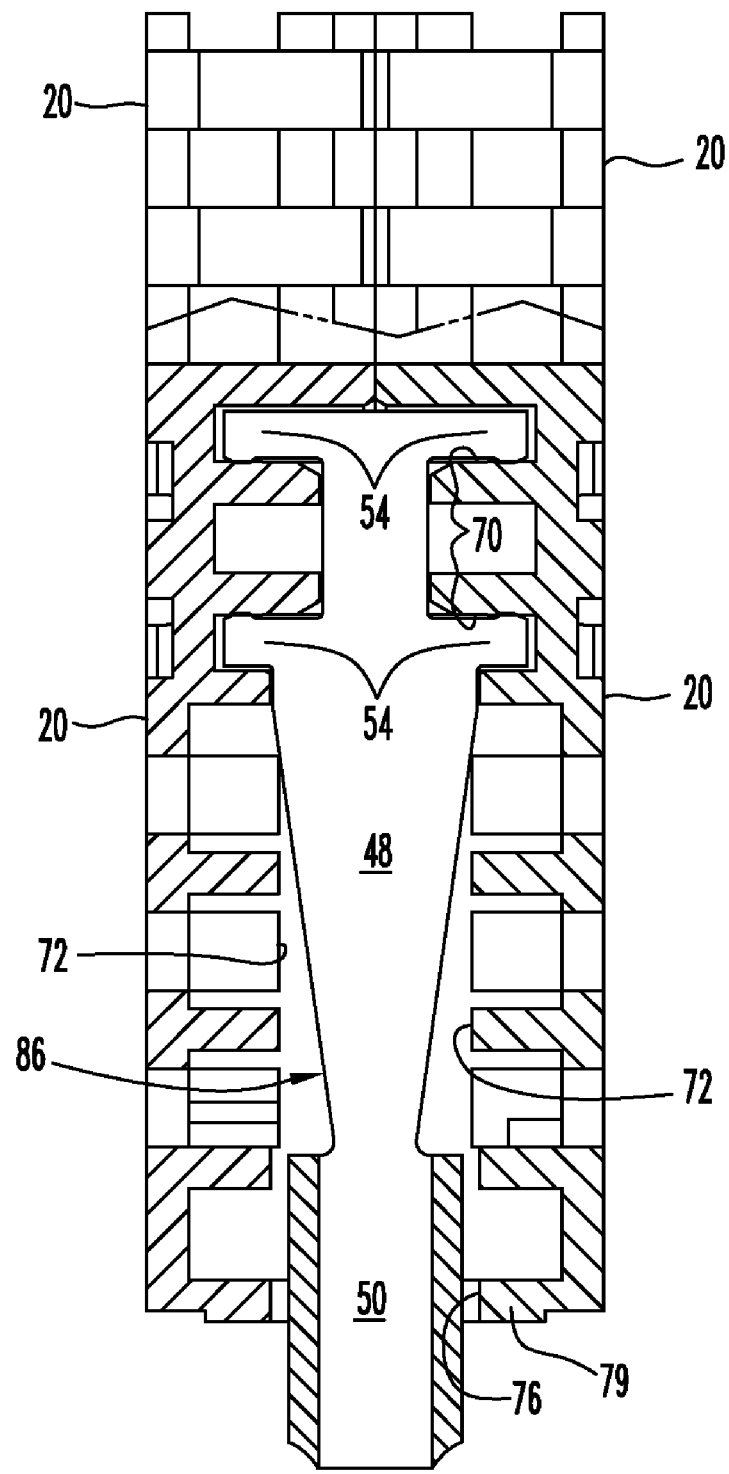
FIG. 8 is a sectional view along line 8-8 of FIG. 4.
Figure 9:
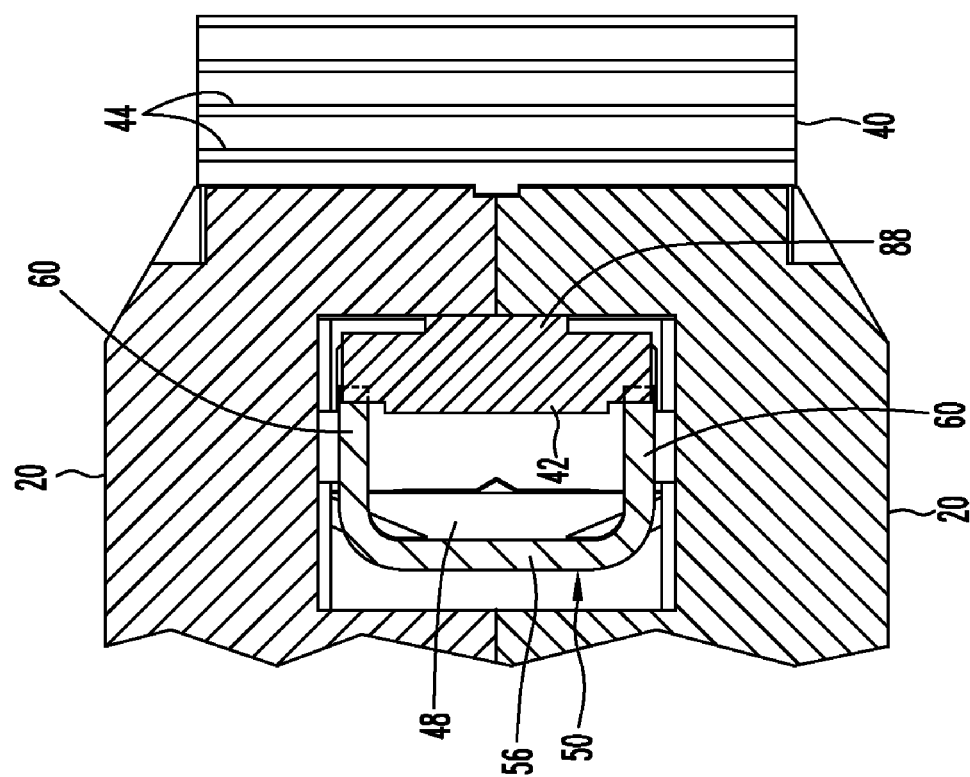
FIG. 9 is a sectional view through the module along line 9-9 of FIG. 7.

Latch member 36 is positioned in one open shell 20 by extending the mounting ribs 54 on one side of member 36 into recesses 70 in the shell with the arm 48 and shift member 50 extending freely in an interior channel 72 in the shell 20. See FIG. 8. The free end of shift member 50 and latch arms 62 extend through opening 76 in module bottom wall 79. The adjacent faces of the pairs of ribs 54 in recesses 70 have tight fits with the adjacent walls of recesses 70 to locate member 36 accurately in channel 72.

Extractor 32 is fitted in an elongate groove 78 extending along the side of the shell 20 holding the latch member 36. Strip body 38 is freely movable along the groove. Spring pocket 46 extends into recess 80 formed on the inner side of groove 78 with compressed spring 34 extending from the bottom of the pocket to the slotted upper wall 82 of the recess. Wall 82 is slotted to accommodate a tool holding spring 34 compressed in pocket 46 during installation of the extractor and spring into the groove 78 and recess 80. Groove 78 extends from wall 79 at the lower end of the shell to step 84 adjacent the upper end of the shell. Spring 34 normally holds extractor 32 in a down position, shown in FIG. 3, with the lower end 81 of the extractor on wall 79. See FIG. 6. Grip element 40 is normally located immediately above step 84 when extractor 32 is held in the down position shown in FIG. 3 by spring 34.

With the extractors 32 and metal latch members 36 positioned in one shell, and electronic component 26 and connector 28 positioned in the shell, the second shell is positioned over the first shell, and the two shells are moved together so that the adjacent edges of the shells abut each other. The shells include post and recess latches on their abutting edges. The latches secure the two shells together to form body 18 with the latch extractor assemblies, electronic component and connector held in place in body 18.

Figure 4:
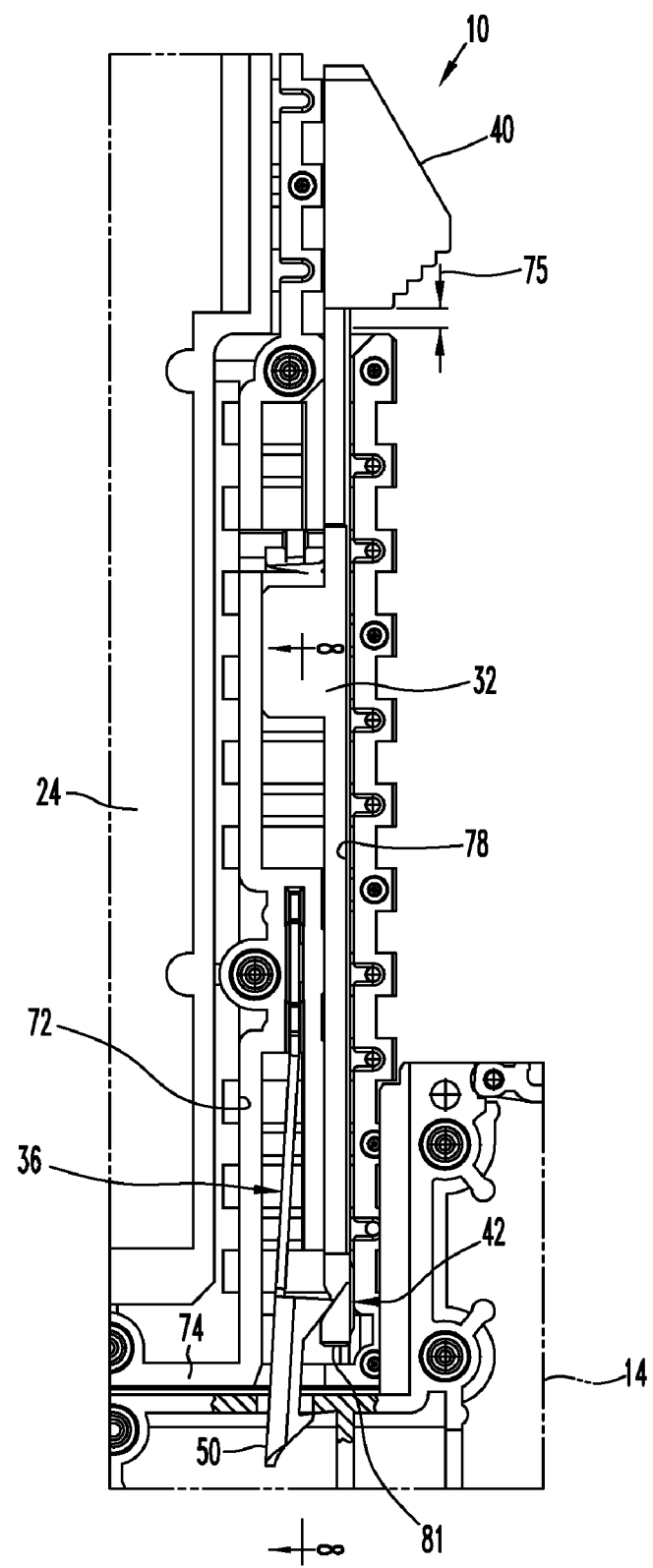
FIG. 4 is like FIG. 3 with the assembly in the unlatched position.
Figure 5:
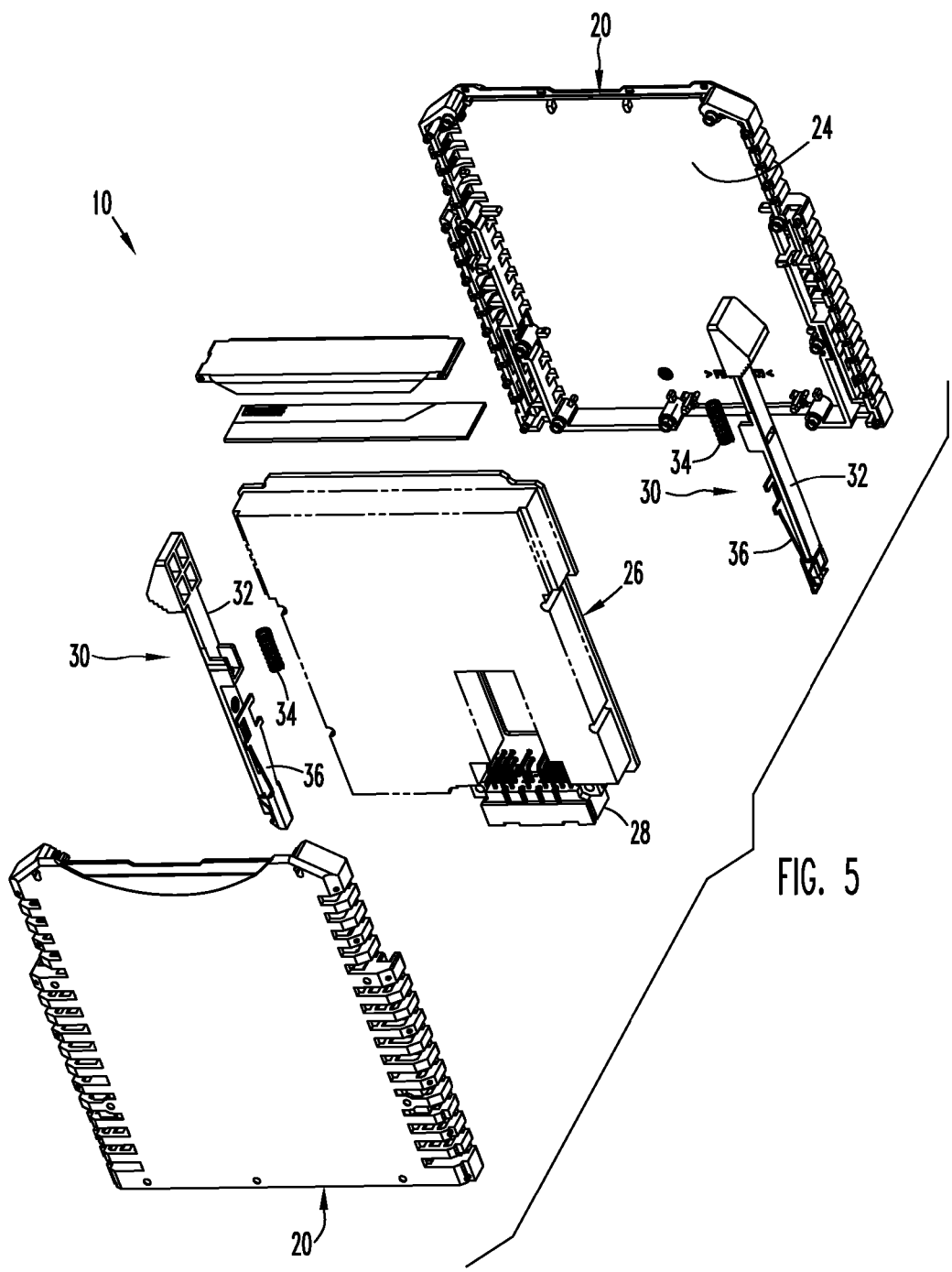
FIG. 5 is an exploded view of the module.
Figure 7:
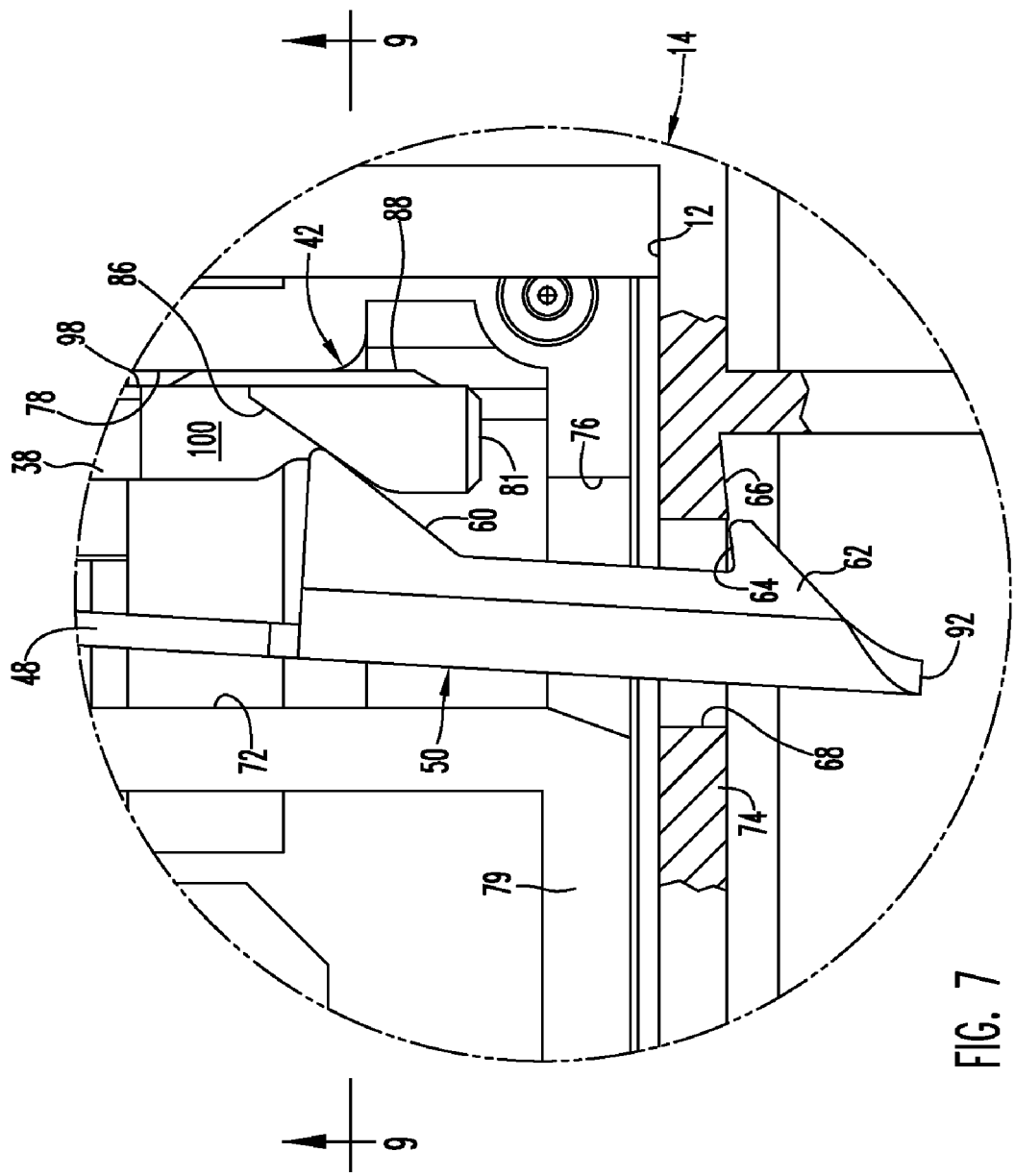

The cam end 42 of each extractor 32 has two angled cam surfaces 86. Surfaces 86 are on opposed sides of cam end 42. When grip elements 40 are pulled up, the cam surfaces 86 immediately engage angled follower arms 60 on the sidewalls 58 of shift members to immediately flex the adjacent spring arms 48 inwardly and move members 50 from latched positions adjacent the outer side of the module, shown in FIGS. 3 and 6, to unlatched positions inwardly from the outer edges of the module, shown in FIGS. 4 and 7. Springs 34 are compressed and ends 81 are raised above wall 79. Spring arms 48 bias the channel members toward the latched position. Upward movement of grip elements 40 short distance 75, shown in FIG. 4, moves cam ends 42 into engagement with shift members 50 to cam members 50 laterally inwardly, away from the adjacent sides of the module, to the unlatched or released position shown in FIGS. 4 and 7.

Assembled module 10 is latched into base 14 by extending the lower end of the module into recess 12. Lead ends 92 of shift members 50 are piloted into latch openings 68 formed through base wall 74. The angled surfaces of latch arms 62 engage the outer edges of openings 68 so that the members 50 are moved inwardly and arms 48 are flexed inwardly in channels 72 until arms 62 pass through the openings 68 and the flexed spring arms 48 move outwardly to move the latch arms 62 outwardly and under latch surfaces 66 to the latched position shown in FIGS. 3 and 6. During latching of the module onto the base, the top of the module is pushed into the recess. Connector 28 engages the connector on base 14. The arms 48 are flexed to move shift members 50 through openings 68 and to the latched positions. The extractors 32 are not used to latch the module to the base.

In order to remove a latched module from the base, an operator pulls the undersurfaces of grip elements 40 up a short distance 75 away from base 14. The edges 44 improve the operator's grip of elements 40. The initial upward movement of the grip elements 40 pulls cam ends 42 up from the position of FIG. 6 to the position of FIG. 7. Cam surfaces 86 on the opposite edges of cam ends 42 are brought immediately into engagement with the angled follower surfaces on arms 60 located on the outer sides of the upper end of shift member 50. Cam ends 42 are supported against outward movement by raised pads 88 which are located centrally on the ends, equidistant between the two cam surfaces 86. Upward movement of cam ends 42 rotates shift member 50 inwardly and flexes spring arm 48 inwardly to move latch arms 62 inwardly a distance beyond latch surface 66 to unlatch the module from the base.

Upward movement of grip elements 40 simultaneously unlatches the two members 50 from base bottom wall 74 and, with further upward movement, withdraws the unlatched module from the base recess and disengages the connectors.

During unlatching of the module, pads 88 on cam ends 42 engage the outer walls of grooves 78. The pads 88 are located between the two laterally spaced cam surfaces 86, in the center of cam end 42, to support the surfaces during inward camming of shift members 50 and prevent twisting of ends 42 and members 50. The pads 88 also space the outer surfaces 98 of strip bodies 38 from the adjacent walls of grooves 78 to reduce friction during unlatching.

Metal shift member 50, with flat base 56 and upstanding channel sidewalls 58 has a channel-shaped cross-section and is very stiff. The stiffness of the member prevents bending of the member during unlatching when forces exerted by the cam end 42 of extractor 32 on the spaced follower arms 60 are transmitted along the length of the member 50 to move latch arms 62 on the bottom of the channel member inwardly and unlatch the module. During unlatching each member 50 directly transmits unlatching forces along each L-shaped sidewall of member 50 from an arm 60 to an arm 62 to move arms 62 inwardly away from the angled latch surfaces 66 on the bottom of the base without bending. The lateral stiffness of the channel-shaped metal shift member 50 assures that the member is not deformed laterally despite location of arms 60 outside of pad 88.

The cam end 42 of extractor 32 and shift member 50 of latch member 36 are fitted together in alignment with follower arms 60 on member 50 extending into recesses 100 formed in the sides of cam end 42.

What we claim as our invention is:

1. An electronic module comprising a module body and a first latch extractor assembly for removably mounting the module body on a support member, the latch extractor assembly including a metal latch member having an elongate spring arm, a mounting portion at one end of the spring arm, and a shift member at the other end of the spring arm, said mounting portion secured to the module body, the shift member including a generally flat base and a first base sidewall extending up from the base at an angle of about 90 degrees so that the shift member is L-shaped and rigid, a first latch arm on the first base sidewall away from the spring arm, a first follower arm on the first base sidewall adjacent the spring arm; and an extractor having an elongate extractor body, a grip element at one end of the extractor body and a first cam surface at the other end of the extractor body, the cam surface engaging the first follower arm; whereby movement of the grip element moves the cam surface along the follower arm to cam the shift member laterally and move the latch arm out of engagement with a support member, the shift member transmitting forces from the follower arm to the latch arm without bending.

2. The module as in claim 1 including a spring biasing the extractor to move the cam surface away from the follower arm.

3. The module as in claim 1 wherein the spring arm is flat and tapered.

4. The module as in claim 3 wherein said base forms extension of said spring arm.

5. The module as in claim 1 wherein the shift member includes a second base sidewall, a second latch arm on the second base sidewall and a second follower arm on the second base sidewall; and the extractor includes a second cam surface engageable with the second follower arm.

6. The module as in claim 5 wherein said shift member is channel-shaped.

7. The module as in claim 1 wherein the latch extractor assembly is located on a first module edge.

8. The module as in claim 7 including a second latch extractor assembly located on a second module edge.

9. The module as in claim 1 wherein the first latch arm is located outside the module and the first follower arm and the cam surface are located inside the module.

10. The module as in claim 1 wherein the extractor body extends to one side of said spring arm and is located between the spring arm and the outer surface of the module, and the grip element is located on the outside of the module body above the metal latch member.

11. The module as in claim 1 wherein the shift member includes a second base sidewall and a second follower arm on said second base sidewall; and the extractor includes a second cam surface engageable with the second follower arm.

12. The module as in claim 11 wherein the extractor includes a pad located away from the shift member, the pad between the first and second cam surfaces, said pad engaging a surface of the module, wherein the pad spaces the extractor body from the module to reduce friction and support the shift member.

13. The module as in claim 12 wherein the shift member includes a recess adjacent each cam surface, the follower arms extending into said recesses.

14. The module as in claim 1 including an electronic component in the module body and an electrical connector attached to the component for forming electrical connections with a complementary electrical connector.

15. The module as in claim 14 wherein said electronic component comprises a power supply device for regulating the voltage of DC power supplied to a process fieldbus.

16. An electronic module comprising a module body, a power supply device for regulating the voltage of DC power supplied to a process fieldbus, an electrical connector joined to the power supply device, the power supply device mounted in the body; a first latch extractor assembly for removably mounting the module on a power supply base for a process fieldbus, the latch extractor assembly including a metal latch member having an elongate spring arm, a mounting portion at one end of the spring arm and a shift member at the other end of the spring arm, said mounting portion secured to the module body, the shift member adjacent the power supply base and including a shift member base, first and second base sidewalls extending up from opposed sides of the base at about 90 degrees so that the shift member is generally channel-shaped, first and second latch arms on the base sides away from the spring arm, first and second follower arms on each base sidewall adjacent the spring arm; and an extractor having an elongate extractor body, a grip element at one end of the extractor body away from the power supply base and first and second cam surfaces on the other end of the extractor body adjacent the shift member, the cam surfaces engaging the follower arms; whereby movement of the grip element moves the cam surfaces along the follower arms to cam the shift member laterally and move the latch arms out of engagement with a power supply base, the shift member transmitting forces from the follower arms to the latch arms without bending.

17. The module as in claim 16 including a pad on the extractor between the same cam surfaces and away from the shift member, the pad engaging a surface of the module to space the extractor body from the module and support the shift member.

18. The module as in claim 16 wherein the latch arms are located outside the module.

19. The module as in claim 16 including a spring mounted between the module body and the extractor, such spring biasing the cam surfaces away from the follower arms.

* * * * *

UNITED STATES PATENT AND TRADEMARK OFFICE
CERTIFICATE OF CORRECTION

| | | |
|---|---|---|
| PATENT NO. | : 8,123,545 B1 | |
| APPLICATION NO. | : 13/069676 | |
| DATED | : February 28, 2012 | |
| INVENTOR(S) | : Correll et al. | |

It is certified that error appears in the above-identified patent and that said Letters Patent is hereby corrected as shown below:

Column 2, Line 46, insert --or sidewalls-- between "sides" and "58".

Column 4, Line 24, insert --laterally-- between "member" and "inwardly".

Column 4, Line 63, insert --an-- between "forms" and "extension".

Column 6, Line 15, replace "sides" with --sidewalls--.

Column 6, Line 16, replace "each" with --the--.

Column 6, Line 17, replace "sidewall" with --sidewalls--.

Signed and Sealed this
Tenth Day of April, 2012

David J. Kappos
*Director of the United States Patent and Trademark Office*